United States Patent
Chang

(10) Patent No.: US 8,835,236 B2
(45) Date of Patent: Sep. 16, 2014

(54) OXIDE SEMICONDUCTOR THIN FILM TRANSISTOR AND METHOD FOR MANUFACTURING THE SAME

(71) Applicant: Chunghwa Picture Tubes, Ltd., Taoyuan (TW)

(72) Inventor: Hsi-Ming Chang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 13/905,140

(22) Filed: May 30, 2013

(65) Prior Publication Data

US 2014/0225194 A1 Aug. 14, 2014

(30) Foreign Application Priority Data

Feb. 8, 2013 (TW) .............................. 102105386 U

(51) Int. Cl.
| | | |
|---|---|---|
| H01L 21/84 | (2006.01) | |
| H01L 21/336 | (2006.01) | |
| H01L 29/12 | (2006.01) | |
| H01L 27/12 | (2006.01) | |
| H01L 29/66 | (2006.01) | |
| H01L 29/786 | (2006.01) | |

(52) U.S. Cl.
CPC ...... *H01L 29/7869* (2013.01); *H01L 29/66742* (2013.01)
USPC ........... 438/158; 438/262; 438/608; 438/104; 438/722; 257/43; 257/347; 257/E29.151; 257/E21.412; 257/E27.112

(58) Field of Classification Search
CPC ............ H01L 27/3248; H01L 27/1251; H01L 2924/13069; H01L 27/1225; H01L 27/1214; H01L 27/3258; H01L 27/3262; H01L 27/3272; H01L 27/3274; H01L 29/4908; H01L 51/0508; H01L 2021/775; H01L 21/02554; H01L 29/7869; H01L 21/02565; H01L 29/42384; H01L 29/786; H01L 29/66765; H01L 29/78669; H01L 29/66742; H01L 29/66; H01L 27/12; H01L 21/02414; H01L 21/02483; H01L 21/84; H01L 21/16; H01L 21/336
USPC .......... 349/139, 143, 147; 438/151, 153, 154, 438/158, 164, 262, 104, 722; 257/347, 257/E21.409, E27.112, E29.273, 43, 59, 257/57, E21.412, E29.068, E29.29, 1, 257/E29.296, E29.151
See application file for complete search history.

(56) References Cited

U.S. PATENT DOCUMENTS

| | | | |
|---|---|---|---|
| 2010/0065838 A1 | 3/2010 | Yamazaki et al. | |
| 2010/0090217 A1 | 4/2010 | Akimoto | |
| 2010/0117076 A1* | 5/2010 | Akimoto et al. | 257/43 |
| 2011/0248261 A1* | 10/2011 | Yamazaki | 257/43 |

FOREIGN PATENT DOCUMENTS

| | | |
|---|---|---|
| JP | 2010062548 A | 3/2010 |
| TW | 201044468 A1 | 12/2010 |

* cited by examiner

*Primary Examiner* — Julio J Maldonado
*Assistant Examiner* — Moazzam Hossain
(74) *Attorney, Agent, or Firm* — CKC & Partners Co., Ltd.

(57) ABSTRACT

A method for manufacturing an oxide semiconductor thin film transistor (TFT) is provided, which includes the steps below. A source electrode and a drain electrode are provided. A patterned insulating layer is formed to partially cover the source electrode and the drain electrode, and expose a portion of the source electrode and a portion of the drain electrode. An oxide semiconductor layer is formed to contact the portion of the source electrode and the portion of the drain electrode. A gate electrode is provided. A gate dielectric layer positioned between the oxide semiconductor layer and the gate electrode is provided. An oxide semiconductor TFT is also provided herein.

10 Claims, 5 Drawing Sheets

OXIDE SEMICONDUCTOR THIN FILM TRANSISTOR AND METHOD FOR MANUFACTURING THE SAME

RELATED APPLICATIONS

This application claims priority to Taiwan Application Serial Number 102105386, filed Feb. 8, 2013, which is herein incorporated by reference.

BACKGROUND

1. Field of the Invention

The present invention generally relates to an oxide semiconductor thin film transistor (TFT) and a method for manufacturing the oxide semiconductor TFT.

2. Description of Related Art

A liquid crystal display is mainly constituted by a thin film transistor (TFT) substrate, a color filter substrate and a liquid crystal molecule layer disposed between the two substrates. There are multiple TFTs disposed on the TFT substrate, and each of the TFTs mainly includes a gate electrode, a gate dielectric layer, a semiconductor layer, a source electrode and a drain electrode. The semiconductor layer may be made of a material including amorphous silicon, polycrystalline silicon, microcrystalline silicon, monocrystalline silicon, organic semiconductors, oxide semiconductors or other suitable materials.

However, compared with the amorphous silicon TFT, the oxide semiconductor TFT possesses higher carrier mobility and thus exhibits better electrical performance. The oxide semiconductor usually needs to be annealed to stabilize the electrical performance of the oxide semiconductor TFT. In general, the temperature of the annealing process should be higher than or equal to 350° C.

Nevertheless, when a metal is exposed in a high temperature furnace during the annealing process, the metal would be oxidized so as to increase the impedance which severely affects the signal transmission. In view of this, there is a need for an improved method for manufacturing an oxide semiconductor TFT to solve the above problems.

SUMMARY

An objective of the present invention is to provide a method for manufacturing an oxide semiconductor thin film transistor (TFT) able to avoid high impedance of a source electrode and a drain electrode due to oxidation thereof during an annealing process.

One aspect of the present invention provides a method for manufacturing an oxide semiconductor TFT, which includes the steps below. A source electrode and a drain electrode are provided. A patterned insulating layer is formed to partially cover the source electrode and the drain electrode, and expose a portion of the source electrode and a portion of the drain electrode. An oxide semiconductor layer is formed to contact the portion of the source electrode and the portion of the drain electrode. A gate electrode is provided. A gate dielectric layer positioned between the oxide semiconductor layer and the gate electrode is provided.

According to one embodiment of the present invention, the method further includes a step of performing an annealing process after the step of forming the oxide semiconductor layer.

According to one embodiment of the present invention, the step of providing the gate dielectric layer is performed before the step of providing the source electrode and the drain electrode.

According to one embodiment of the present invention, the step of providing the gate dielectric layer is performed after the step of providing the source electrode and the drain electrode.

According to one embodiment of the present invention, the step of forming the patterned insulating layer includes forming an insulating layer to completely cover the source electrode and the drain electrode, and forming at least one opening in the insulating layer to expose the portion of the source electrode and the portion of the drain electrode.

According to one embodiment of the present invention, the step of forming the patterned insulating layer includes forming an insulating layer to completely cover the source electrode and the drain electrode, and forming a first opening and a second opening in the insulating layer to respectively expose the portion of the source electrode and the portion of the drain electrode.

Another aspect of the present invention provides an oxide semiconductor TFT including a source electrode and a drain electrode, a patterned insulating layer, an oxide semiconductor layer, a gate electrode and a gate dielectric layer. The patterned insulating layer partially covers the source electrode and the drain electrode, in which the patterned insulating layer includes at least one opening exposing a portion of the source electrode and a portion of the drain electrode. The oxide semiconductor layer contacts the portion of the source electrode and the portion of the drain electrode. The gate dielectric layer is disposed between the oxide semiconductor layer and the gate electrode.

According to one embodiment of the present invention, the opening is substantially aligned with the gate electrode.

According to one embodiment of the present invention, the patterned insulating layer includes only one opening, and the opening has a length greater than the distance between the source electrode and the drain electrode.

According to one embodiment of the present invention, the gate dielectric layer is disposed beneath the source electrode and the drain electrode.

According to one embodiment of the present invention, the opening includes a first opening and a second opening respectively exposing the portion of the source electrode and the portion of the drain electrode.

According to one embodiment of the present invention, the gate dielectric layer is disposed above the source electrode and the drain electrode.

In the embodiments of the present invention, the patterned insulating layer is formed firstly to partially cover the source electrode and the drain electrode, and the oxide semiconductor layer is then formed to contact the exposed portion of the source electrode and the exposed portion of the drain electrode, and the annealing process is then performed. As such, the source electrode and the drain electrode are completely covered by the patterned insulating layer and the oxide semiconductor layer and not exposed during the annealing process so as to avoid the oxidation of the source electrode and the drain electrode.

BRIEF DESCRIPTION OF THE DRAWINGS

The invention may be more fully understood by reading the following detailed description of the embodiment, with reference made to the accompanying drawings as follows.

DETAILED DESCRIPTION

Figure 1:
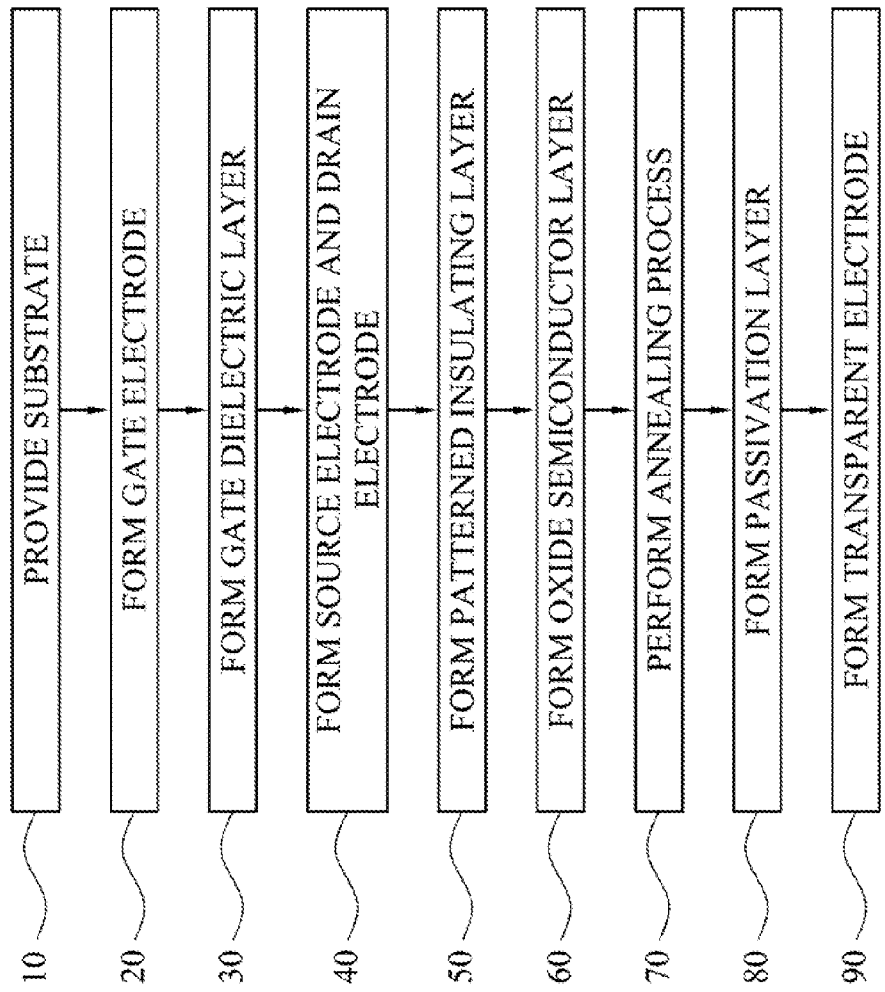
FIG. 1 is a flowchart of a method for manufacturing an oxide semiconductor thin film transistor (TFT) substrate according to one embodiment of the present invention.
Figure 2A:
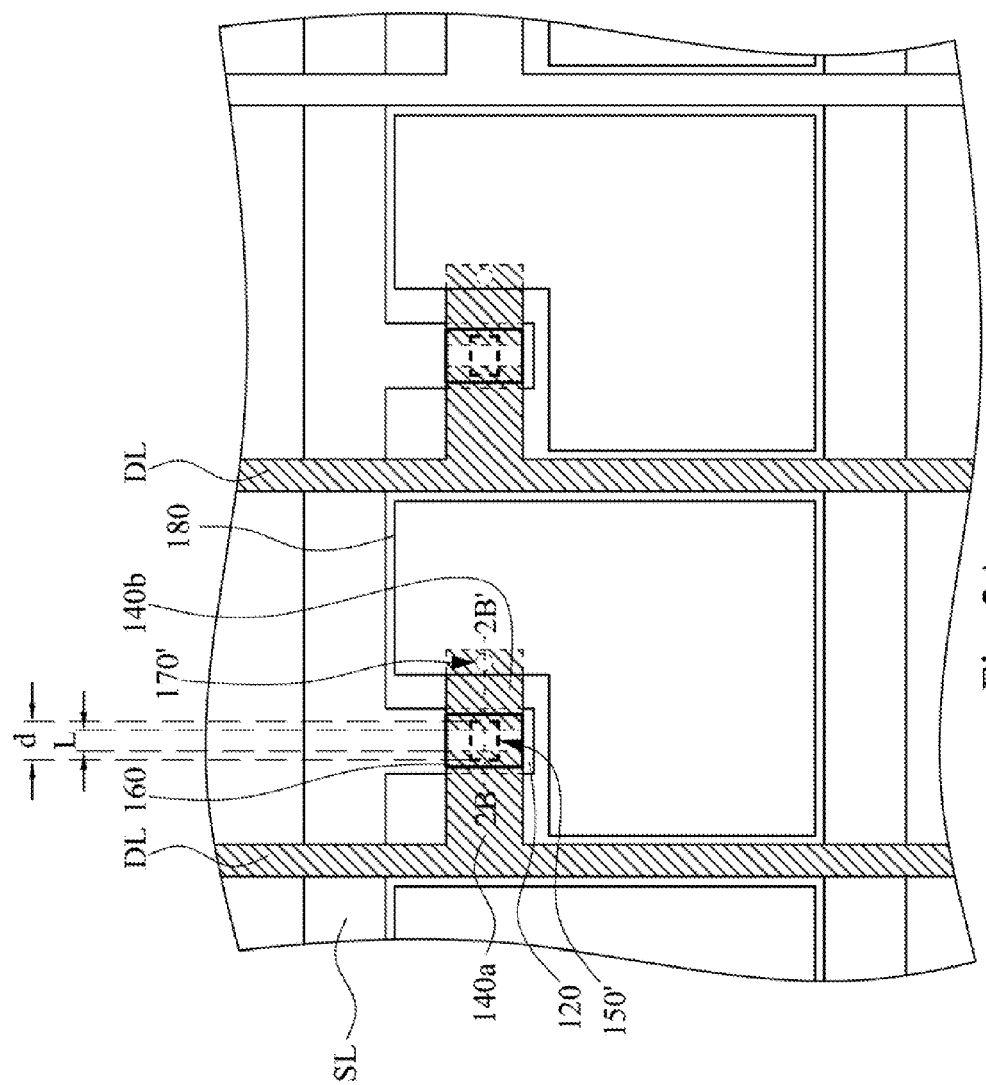
FIG. 2A is a top view of an oxide semiconductor TFT substrate according to one embodiment of the present invention.
Figure 2B:
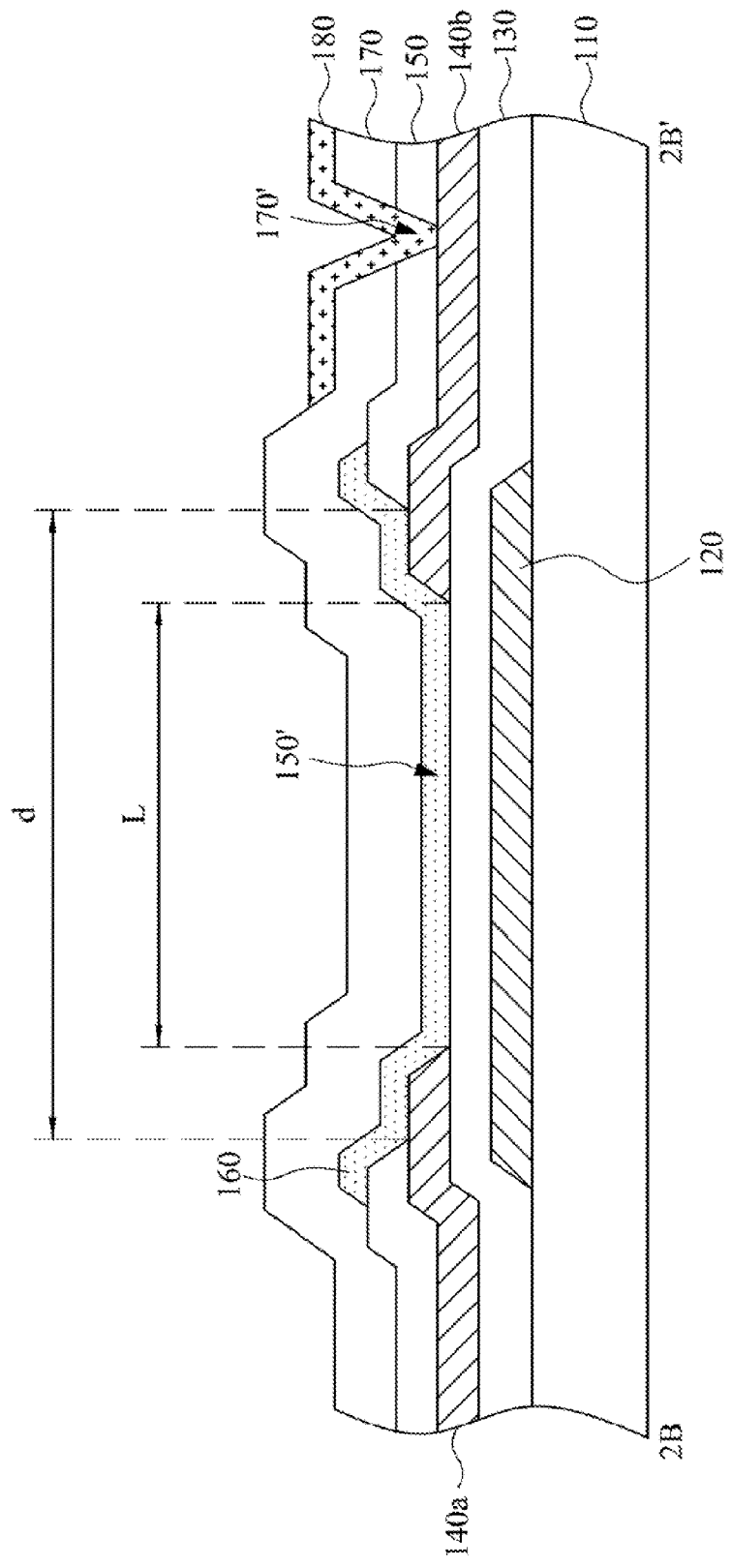
FIG. 2B is a cross-sectional view of the oxide semiconductor TFT substrate taken along the line 2B-2B' of FIG. 2A.

FIG. 1 is a flowchart of a method for manufacturing an oxide semiconductor thin film transistor (TFT) substrate according to one embodiment of the present invention. FIG. 2A is a top view of an oxide semiconductor TFT substrate according to one embodiment of the present invention. The circuit layout of the oxide semiconductor TFT substrate can be appropriately changed, and not limited to the embodiment shown in FIG. 2A. FIG. 2B is a cross-sectional view of the oxide semiconductor TFT substrate taken along the line 2B-2B' of FIG. 2A. In general, the type of the oxide semiconductor TFT may be a top-gate type or a bottom-gate type. Concerning the bottom-gate type oxide semiconductor TFT, the gate electrode is positioned beneath the semiconductor layer. Concerning the top-gate type oxide semiconductor TFT, the gate electrode is positioned above the semiconductor layer. There is a bottom-gate type oxide semiconductor TFT shown in FIGS. 2A-2B, but not limited thereto.

In Step 10, a substrate 110 is provided, as shown in FIG. 2B. The substrate 110 should have sufficient mechanical strength, such as glass, quartz, transparent polymer materials or other suitable materials.

In Step 20, a gate electrode 120 is formed on the substrate 110, as shown in FIGS. 2A-2B. As shown in FIG. 2A, multiple scan lines SL parallel to each other may be simultaneously formed on the substrate 110 during forming the gate electrode 120. Further, common electrode lines (not shown) may also be simultaneously formed on the substrate 110. The common electrode lines may be parallel to the extending direction of the scan lines SL. For instance, a metal layer (not shown) is formed on the substrate 110 by utilizing a sputtering process, an evaporation process or other thin film deposition techniques, and a photolithographic and etching process is then performed to form the gate electrode 120 and the scan lines SL.

In Step 30, a gate dielectric layer 130 is formed to cover the gate electrode 120, as shown in FIG. 2B. The gate dielectric layer 130 may also cover the scan lines SL. The gate dielectric layer 130 may be a single layer or a multilayer structure and made of a material including organic dielectric materials, inorganic dielectric materials or a combination thereof. The organic dielectric materials may be polyimide (PI), other suitable materials or a combination thereof. The inorganic dielectric materials may be silicon oxide, silicon nitride, silicon oxynitride, other suitable materials or a combination thereof. The gate dielectric layer 130 may be formed by employing a chemical vapor deposition (CVD) method or other suitable thin film deposition techniques.

In Step 40, the source electrode 140a and the drain electrode 140b are formed on the gate dielectric layer 130, as shown in FIGS. 2A-2B. As shown in FIG. 2A, multiple data lines DL parallel to each other may be simultaneously formed during forming the source electrode 140a and the drain electrode 140b. The data lines DL and the scan lines SL are across with each other so as to to define multiple sub-pixel areas of the substrate 110. For instance, a metal layer (not shown) is formed on the gate dielectric layer 130 by utilizing a sputtering process, an evaporation process or other thin film deposition techniques, and a photolithographic and etching process is then performed to form the source electrode 140a, the drain electrode 140b and the data lines DL. The gate electrode 120, the source electrode 140a and the drain electrode 140b may be a single layer or a multilayer structure and made of metal or a metal compound. The metal includes molybdenum (Mo), chromium (Cr), aluminum (Al), neodymium (Nd), titanium (Ti), copper (Cu), silver (Ag), gold (Au), zinc (Zn), indium (In), gallium (Ga), other suitable materials or a combination thereof. The metal compound includes metal alloys, metal oxides, metal nitrides, metal oxynitrides, other suitable materials or a combination thereof.

In Step 50, a patterned insulating layer 150 is formed to partially cover the source electrode 140a and the drain electrode 140b, and expose a portion of the source electrode 140a and a portion of the drain electrode 140b, as shown in FIG. 2B. The patterned insulating layer 150 may also completely cover the data lines DL that belong to a same layer as the source electrode 140a and the drain electrode 140b. The patterned insulating layer 150 is used to protect and prevent the source electrode 140a, the drain electrode 140b and other elements that belong to the same layer thereas (e.g., data lines DL) from oxidation during subsequent annealing process (i.e., Step 70). Therefore, the contact impedance between the drain electrode 140b and a transparent electrode and the impedance of the data line DL would not be influenced by the annealing process. The pattered insulating layer 150 may be a single layer or a multilayer structure and made of a material including high temperature resistant organic dielectric materials, inorganic dielectric materials or a combination thereof. The organic dielectric materials may be polyimide (PI), other suitable materials or a combination thereof. The inorganic dielectric materials may be silicon oxide, silicon nitride, silicon oxynitride, other suitable materials or a combination thereof.

In one embodiment, the step of forming the patterned insulating layer 150 includes forming an insulating layer (not shown) to completely cover the source electrode 140a and the drain electrode 140b, and then forming at least one opening 150' to expose a portion of the source electrode 140a and a portion of the drain electrode 140b, as shown in FIG. 2B. The position of the opening 150' is the predetermined contact area between the oxide semiconductor and the source electrode 140a and between the oxide semiconductor and the drain electrode 140b. For instance, the insulating layer (not shown) is formed by employing a CVD method or other suitable thin film deposition techniques, and a photolithographic and etching process is then performed to form the opening 150'.

Figure 3:
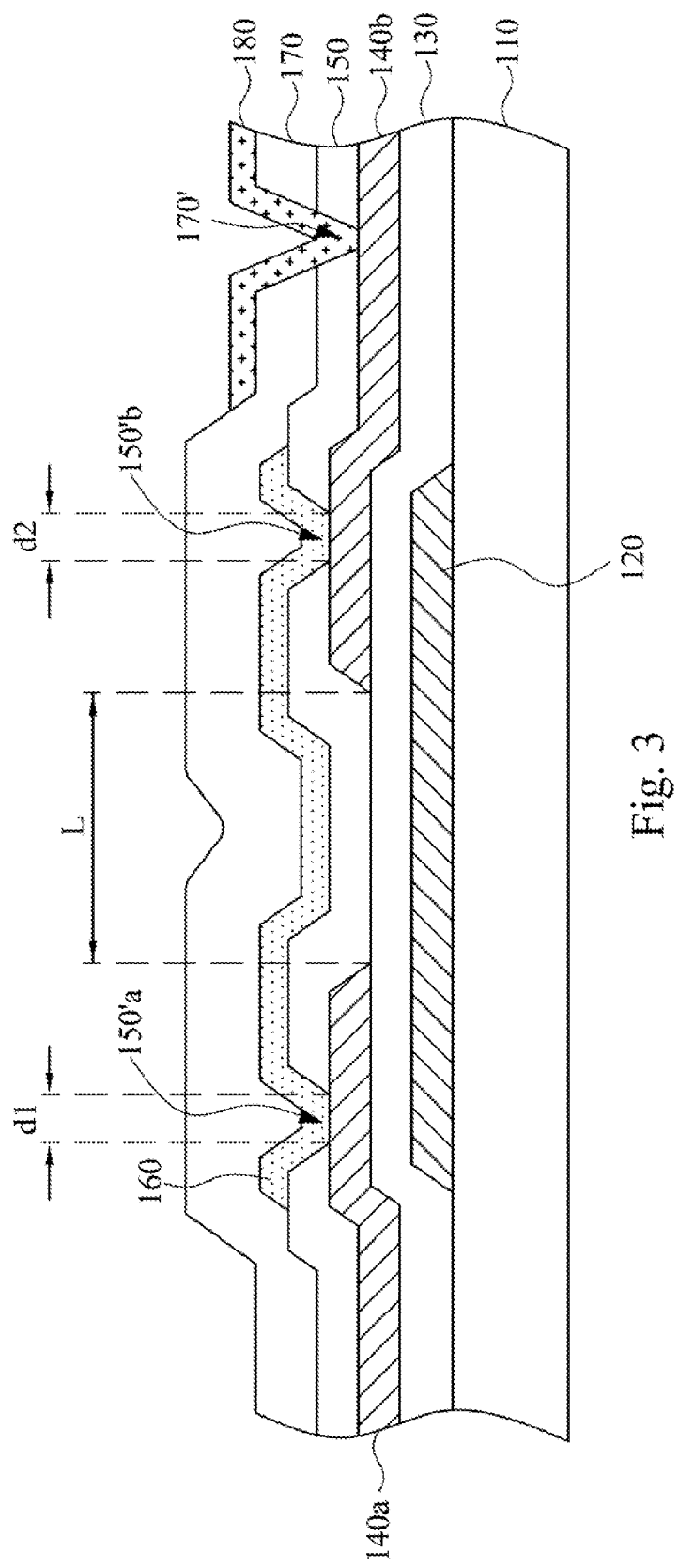
FIG. 3 is a cross-sectional view of an oxide semiconductor TFT according to another embodiment of the present invention.

In another embodiment, as shown in FIG. 3, an insulating layer (not shown) is formed to completely cover the source electrode 140a and the drain electrode 140b, and a first opening 150'a and a second opening 150'b are then formed in the insulating layer to respectively expose a portion of the source electrode 140a and a portion of the drain electrode 140b. Certainly, the number and the position of the opening(s) of the patterned insulating layer 150 in practical applications are not limited to the embodiments shown in FIG. 2B and FIG. 3.

In Step 60, an oxide semiconductor layer 160 is formed to contact the portion of the source electrode 140a and the portion of the drain electrode 140b, as shown in FIGS. 2A-2B. The oxide semiconductor layer 160 may be a single layer or a multilayer structure and made of zinc oxide (ZnO), zinc tin oxide (ZnSnO), cadmium tin oxide (CdSnO), gallium tin oxide (GaSnO), titanium tin oxide (TiSnO), indium gallium zinc oxide (InGaZnO), indium zinc oxide (InZnO), copper aluminum oxide (CuAlO), strontium copper oxide (SrCuO), lanthanum copper oxychalcogenide (LaCuOS), other suitable materials or a combination thereof. For an example, an oxide semiconductor material layer (not shown) is formed to completely cover the pattern insulating layer 150, the portion of the source electrode 140a and the portion of the drain electrode 140b by employing a sputtering process, and a photolithographic and etching process is then performed to form the oxide semiconductor layer 160.

In Step 70, an annealing process is performed to treat the oxide semiconductor layer 160. Specifically, a laminated structure including the oxide semiconductor layer 160, the source electrode 140a and the drain electrode 140b covered by the patterned insulating layer 150 is placed into a high temperature furnace to carry out the annealing process, and thus to obtain the oxide semiconductor layer 160 with more stable electrical characteristics. The temperature of the annealing process may be in a range of about 350° C. to about 400° C.

It is worth mentioning that the annealed oxide semiconductor layer 160 would not be directly contacted with the solution of the wet process since the step of forming the source electrode 140a and the drain electrode 140b, forming the patterned insulating layer 150, forming the oxide semiconductor layer 160 and performing the annealing process are sequentially performed. Therefore, the electrical characteristics of the oxide semiconductor layer 160 would not be affected by the wet process.

In Step 80, a passivation layer 170 is formed to cover the patterned insulating layer 150 and the oxide semiconductor layer 160, as shown in FIG. 2B. The passivation layer 170 has a contact hole 170' exposing a portion of the drain electrode 140b. The passivation layer 170 is a single layer or a multilayer structure and made of a material including organic dielectric materials, inorganic dielectric materials or a combination thereof. The materials of passivation layer 170 may be referred to that exemplified for the above-mentioned gate dielectric layer 130. For instance, a passivation material layer (not shown) is formed by employing a CVD method or other suitable thin film deposition techniques, and a photolithographic and etching process is then performed to form the contact hole 170'.

In Step 90, a transparent electrode 180 is formed on the passivation layer 170 and in the contact hole 170' so as to connect to the drain electrode 140b, as shown in FIGS. 2A-2B. The transparent electrode 180 is a single layer or a multilayer structure and made of indium tin oxide (ITO), hafnium oxide (HfOx), aluminum zinc oxide (AZO), aluminum tin oxide (ATO), gallium zinc oxide (GZO), indium titanium oxide (ITiO), indium molybdenum oxide (IMO) or other transparent conductive materials. For instance, a transparent conductive layer (not shown) is formed on the passivation layer 170 by utilizing a sputtering process or other thin film deposition techniques, and a photolithographic and etching process is then performed to form the transparent electrode 180.

Figure 4:
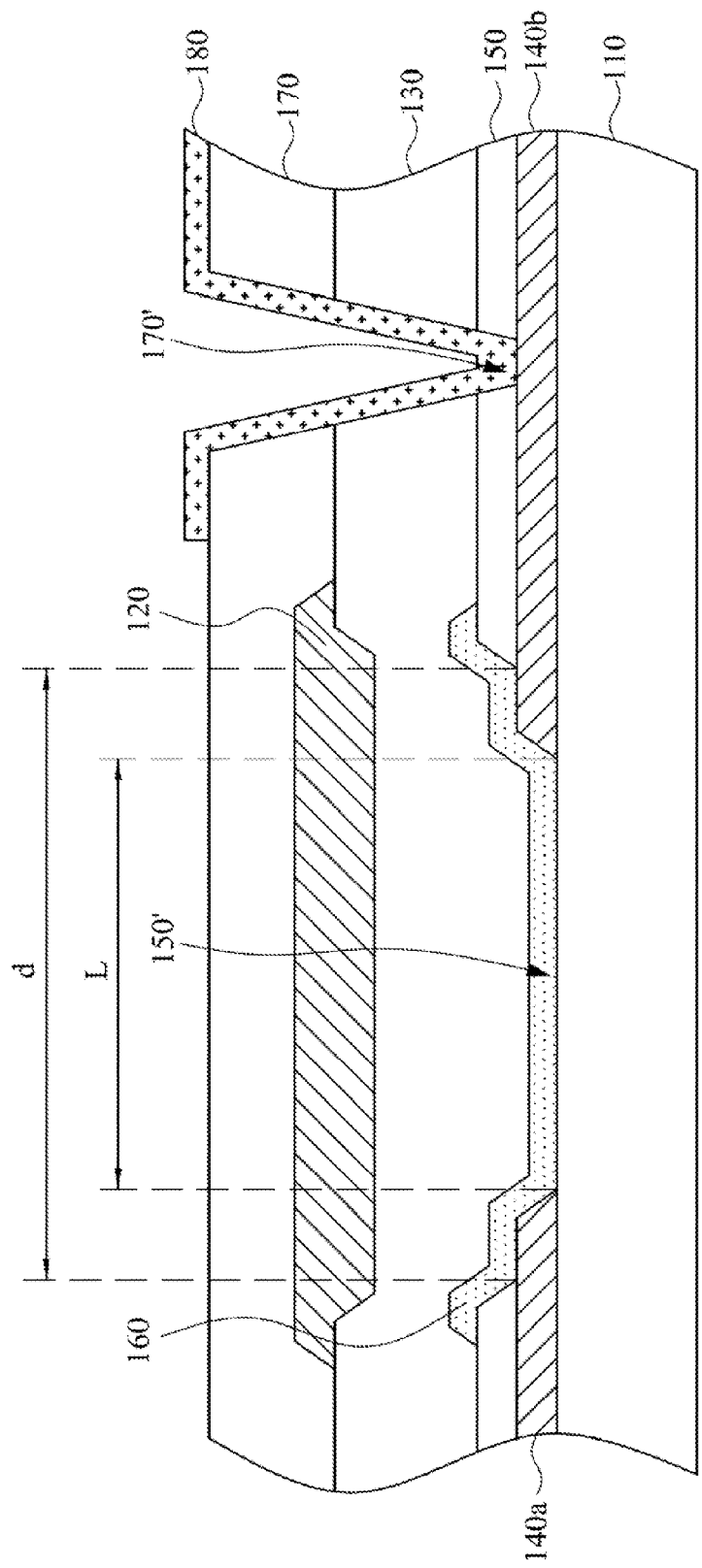
FIG. 4 is a cross-sectional view of an oxide semiconductor TFT according to further embodiment of the present invention.

FIG. 4 is a cross-sectional view of a top-gate type oxide semiconductor TFT according to further embodiment of the present invention. In this method, a gate dielectric layer and a gate electrode are sequentially formed after forming an oxide semiconductor layer. The manufacturing method includes the following steps in sequence. First, a source electrode 140a and a drain electrode 140b are formed on a substrate 110. A patterned insulating layer 150 is formed to partially cover the source electrode 140a and the drain electrode 140b, and expose a portion of the source electrode 140a and a portion of the drain electrode 140b. The oxide semiconductor layer 160 is formed to contact the portion of the source electrode 140a and the portion of the drain electrode 140b. The gate dielectric layer 130 is formed to cover the oxide semiconductor layer 160 and the patterned insulating layer 150. The gate electrode 120 is formed on the gate dielectric layer 130. A passivation layer 170 is formed to cover the gate electrode 120, in which the passivation layer 170 has a contact hole 170' exposing a portion of the drain electrode 140b. A transparent electrode 180 is formed on the passivation layer 170 and in the contact hole 170'.

Another embodiment of the present invention provides an oxide semiconductor TFT including a source electrode 140a and a drain electrode 140b, a patterned insulating layer 150, an oxide semiconductor layer 160, a gate electrode 120 and a gate dielectric layer 130, as shown in FIGS. 2B, 3 and 4. The oxide semiconductor TFT may be a bottom-gate type oxide semiconductor TFT (i.e., the gate dielectric layer 130 is disposed beneath the source electrode 140a and the drain electrode 140b) shown in FIGS. 2B and 3, or a top-gate type oxide semiconductor TFT (i.e., the gate dielectric layer 130 is disposed above the source electrode 140a and the drain electrode 140b) shown in FIG. 4.

The patterned insulating layer 150 partially covers the source electrode 140a and the drain electrode 140b, in which the patterned insulating layer 150 includes at least one opening 150' exposing a portion of the source electrode 140a and a portion of the drain electrode 140b, as shown in FIGS. 2B and 4.

In the embodiment, the opening 150' is substantially aligned with the gate electrode 120, as shown in FIGS. 2B and 4. The length d of the opening 150' is greater than the distance L between the source electrode 140a and the drain electrode 140b. The distance L refers to the channel length.

In another embodiment, as shown in FIG. 3, the opening includes a first opening 150'a and a second opening 150'b to respectively expose the portion of the source electrode 140a and the portion of the drain electrode 140b. The proportional relationships between the distance L and the length d1 of the first opening 150'a and between the distance L and the length d2 of the second opening 150'b are not limited.

As shown in FIGS. 2B, 3 and 4, the oxide semiconductor layer 160 covers the patterned insulating layer 150 and contacts the portion of the source electrode 140a and the portion of the drain electrode 140b. Thus, the source electrode 140a and the drain electrode 140b are completely covered by the patterned insulating layer 150 and the oxide semiconductor layer 160 and not exposed during the annealing process so as to avoid the oxidation of the source electrode 140a and the drain electrode 140b.

In one embodiment, a display panel is constituted by a substrate including the oxide semiconductor TFT of the embodiment of the present invention, an opposite substrate (not shown) and a display medium layer (not shown). The display panel may be a non-self-emissive display or a self-emissive display, but not limited thereto.

In summary, in the embodiments of the present invention, the source electrode, the drain electrode and the elements that belong to the same layer and they are protected by the patterned insulating layer. Because the source electrode, the drain electrode and the elements that belong to the same layer and they are not directly exposed in the high temperature furnace, the affects of the impedance and the signal transmission due to the oxidation can be avoided so as to effectively solve the problems in the art.

It will be apparent to those ordinarily skilled in the art that various modifications and variations may be made to the structure of the present invention without departing from the scope or spirit of the invention. In view of the foregoing, it is intended that the present invention cover modifications and variations thereof provided they fall within the scope of the following claims.

What is claimed is:

1. A method for manufacturing an oxide semiconductor thin film transistor (TFT), comprising the steps of:
    providing a source electrode and a drain electrode;
    forming a patterned insulating layer to partially cover the source electrode and the drain electrode, wherein the patterned insulating layer includes at least one opening exposing a portion of the source electrode and a portion of the drain electrode, and the opening has a length greater than the distance between the source electrode and the drain electrode;
    forming an oxide semiconductor layer to contact the portion of the source electrode and the portion of the drain electrode;
    providing a gate electrode; and
    providing a gate dielectric layer positioned between the oxide semiconductor layer and the gate electrode.

2. The method of claim 1, further comprising the step of performing an annealing process after the step of forming the oxide semiconductor layer.

3. The method of claim 1, wherein the step of providing the gate dielectric layer is performed before the step of providing the source electrode and the drain electrode.

4. The method of claim 1, wherein the step of providing the gate dielectric layer is performed after the step of providing the source electrode and the drain electrode.

5. The method of claim 1, wherein the step of forming the patterned insulating layer comprises:
    forming an insulating layer to completely cover the source electrode and the drain electrode; and
    forming the opening in the insulating layer to expose the portion of the source electrode and the portion of the drain electrode.

6. An oxide semiconductor TFT, comprising:
    a source electrode and a drain electrode;
    a patterned insulating layer partially covering the source electrode and the drain electrode, wherein the patterned insulating layer includes at least one opening exposing a portion of the source electrode and a portion of the drain electrode, and the opening has a length greater than the distance between the source electrode and the drain electrode;
    an oxide semiconductor layer contacting the portion of the source electrode and the portion of the drain electrode;
    a gate electrode; and
    a gate dielectric layer disposed between the oxide semiconductor layer and the gate electrode.

7. The oxide semiconductor TFT of claim 6, wherein the opening is substantially aligned with the gate electrode.

8. The oxide semiconductor TFT of claim 6, wherein the gate dielectric layer is disposed beneath the source electrode and the drain electrode.

9. The oxide semiconductor TFT of claim 6, wherein the opening includes a first opening and a second opening respectively exposing the portion of the source electrode and the portion of the drain electrode.

10. The oxide semiconductor TFT of claim 6, wherein the gate dielectric layer is disposed above the source electrode and the drain electrode.

* * * * *